United States Patent
Tomiha et al.

(10) Patent No.: US 8,035,385 B2
(45) Date of Patent: Oct. 11, 2011

(54) MRI SYSTEM AND RF COIL WITH ENHANCED COOLING IN VICINTY OF INCLUDED CIRCUIT ELEMENTS

(75) Inventors: Sadanori Tomiha, Nasushiobara (JP); Takahiro Ishihara, Otawara (JP); Shinji Mitsui, Nasushiobara (JP); Hiromitsu Takamori, Otawara (JP); Ayumi Katsunuma, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 229 days.

(21) Appl. No.: 12/273,787

(22) Filed: Nov. 19, 2008

(65) Prior Publication Data

US 2009/0134875 A1    May 28, 2009

(30) Foreign Application Priority Data

Nov. 22, 2007   (JP) .................................. 2007-303003
Oct. 22, 2008   (JP) .................................. 2008-272463

(51) Int. Cl.
*G01V 3/00*   (2006.01)
(52) U.S. Cl. ...................................................... 324/318
(58) Field of Classification Search .......... 324/300–322; 600/410–435; 333/219–235
See application file for complete search history.

(56) References Cited

U.S. PATENT DOCUMENTS

| | | | |
|---|---|---|---|
| 6,496,006 B1 | 12/2002 | Vrijheid | |
| 6,768,306 B2 * | 7/2004 | Morita et al. | 324/322 |
| 6,967,482 B2 * | 11/2005 | Morita et al. | 324/322 |
| 6,975,118 B2 * | 12/2005 | Okada et al. | 324/321 |
| 6,998,842 B2 | 2/2006 | Sinnema et al. | |
| 7,084,635 B2 * | 8/2006 | Morita et al. | 324/322 |
| 7,141,979 B2 * | 11/2006 | Marek | 324/322 |
| 7,161,353 B2 | 1/2007 | Schaafe et al. | |
| 7,663,366 B2 | 2/2010 | Takamori | |
| 7,701,216 B2 | 4/2010 | Du et al. | |
| 7,759,935 B2 * | 7/2010 | DeVries et al. | 324/318 |
| 2006/0038567 A1 | 2/2006 | Morita et al. | |
| 2007/0016003 A1 | 1/2007 | Piron et al. | |
| 2008/0173026 A1 | 7/2008 | Mita et al. | |
| 2009/0134874 A1 | 5/2009 | Katsunuma et al. | |
| 2009/0174407 A1 | 7/2009 | Han et al. | |

FOREIGN PATENT DOCUMENTS

| | | |
|---|---|---|
| JP | 8-322815 | 12/1996 |
| JP | 09-000510 | 1/1997 |
| JP | 11-244255 | 9/1999 |
| JP | 2004-33380 | 2/2004 |

OTHER PUBLICATIONS

Chinese Search Report dated Aug. 10, 2010, re Japanese Patent Application No. H7-157482.

* cited by examiner

*Primary Examiner* — Dixomara Vargas
(74) *Attorney, Agent, or Firm* — Nixon & Vanderhye PC (57) ABSTRACT

When an RF coil in a magnetic resonance imaging system includes a plurality of conductive members and circuit elements connected to the conductive members, at least part of each of the conductive members is formed to a thickness so as to dissipate heat generated from the circuit elements. Moreover, the magnetic resonance imaging system is configured to include a cooling unit that circulates cooling air over the surfaces of the circuit elements provided in the RF coil.

20 Claims, 5 Drawing Sheets

MRI SYSTEM AND RF COIL WITH ENHANCED COOLING IN VICINITY OF INCLUDED CIRCUIT ELEMENTS

CROSS-REFERENCE TO RELATED APPLICATIONS

This application is based upon and claims the benefit of priority from the prior Japanese Patent Application No. 2007-303003, filed on Nov. 22, 2007, and No. 2008-272463, filed on Oct. 22, 2008; the entire contents of which are incorporated herein by reference. This application is related to copending commonly owned application Ser. No. 12/273,013 filed Nov. 18, 2008, naming Katsunuma, Tsujita and Takamori as co-inventors.

BACKGROUND OF THE INVENTION

1. Field of the Invention

The present invention relates to a magnetic resonance imaging system and a Radio Frequency (RF) coil. Particularly, the present invention relates to a magnetic resonance imaging system and an RF coil that can suppress heat generated around the RF coil.

2. Description of the Related Art

A magnetic resonance imaging system applies a high-frequency magnetic field over a subject placed in a static magnetic field, detects a nuclear magnetic resonance signal emitted from the subject with the high-frequency magnetic field, and reconstructs an image. Such magnetic resonance imaging system includes an RF coil that applies the high-frequency magnetic field over the subject, and detects a magnetic resonance signal emitted from the subject. The RF coil can be a single coil for both transmitting and receiving that performs application of a high-frequency magnetic field and detection of a magnetic resonance signal, or separate coils for transmitting and receiving to perform respective operations.

Generally, an RF coil is formed by using thin conductive members, such as copper foil, and the conductive members are connected to certain circuit elements for controlling operation of the RF coil. For example, a capacitor included in a resonant circuit for resonating the frequency of a high-frequency magnetic field with a resonance frequency, and/or a P-Intrinsic-N (PIN) diode configured to be a switch for switching the operation mode between transmitting and receiving when the RF coil is configured to be used for both transmitting and receiving, are connected to the RF coil.

Such circuit elements generate heat when a current is supplied. Consequently, when the magnetic resonance imaging system is operated, heat is generated around the RF coil. The heat can be conducted to the subject. For this reason, during operation of the magnetic resonance imaging system, the heat generated around the RF coil needs to be appropriately cooled. To solve the problem, a technology is contrived for cooling heat generated in a magnetic resonance imaging system by providing a cooling device in the magnetic resonance imaging system, and feeding cooling air to a portion that may generate heat, such as an area around an RF coil by using the cooling device (for example, see JP-A H8-322815 (KOKAI)).

However, heat is locally generated due to heat generation by various circuit elements around an RE coil, so that sometimes heat generation cannot be efficiently suppressed in some cases only by simply feeding cooling air to the RF coil as conventionally performed. Such phenomenon is often observed when a large current needs to be supplied to the RF coil, for example, when scanning a heavy subject.

SUMMARY OF THE INVENTION

According to one aspect of the present invention, a magnetic resonance imaging system includes a Radio Frequency (RE) coil that applies a high-frequency magnetic field to a subject placed in a static magnetic field, wherein the RF coil includes a plurality of conductive members; and circuit elements connected to the conductive members, and each of the conductive members is at least partially formed so as to meet at least any one of conditions of a thickness, a shape, and a material that are capable of dissipating heat generated from the circuit elements.

According to another aspect of the present invention, a Radio Frequency (RF) coil that is provided in a magnetic resonance imaging system and that applies a high-frequency magnetic field to a subject placed in a static magnetic field includes a plurality of conductive members; and circuit elements connected to the conductive members, wherein each of the conductive members is at least partially formed so as to meet at least any one of conditions of a thickness, a shape, and a material that are capable of dissipating heat generated from the circuit elements.

DETAILED DESCRIPTION OF THE INVENTION

Exemplary embodiments of a magnetic resonance imaging system and a Radio Frequency (RF) coil of the present invention will be explained below in detail with reference to the accompanying drawings. Hereinafter, a Magnetic Resonance Imaging system is referred to as an MRI system.

Figure 1:
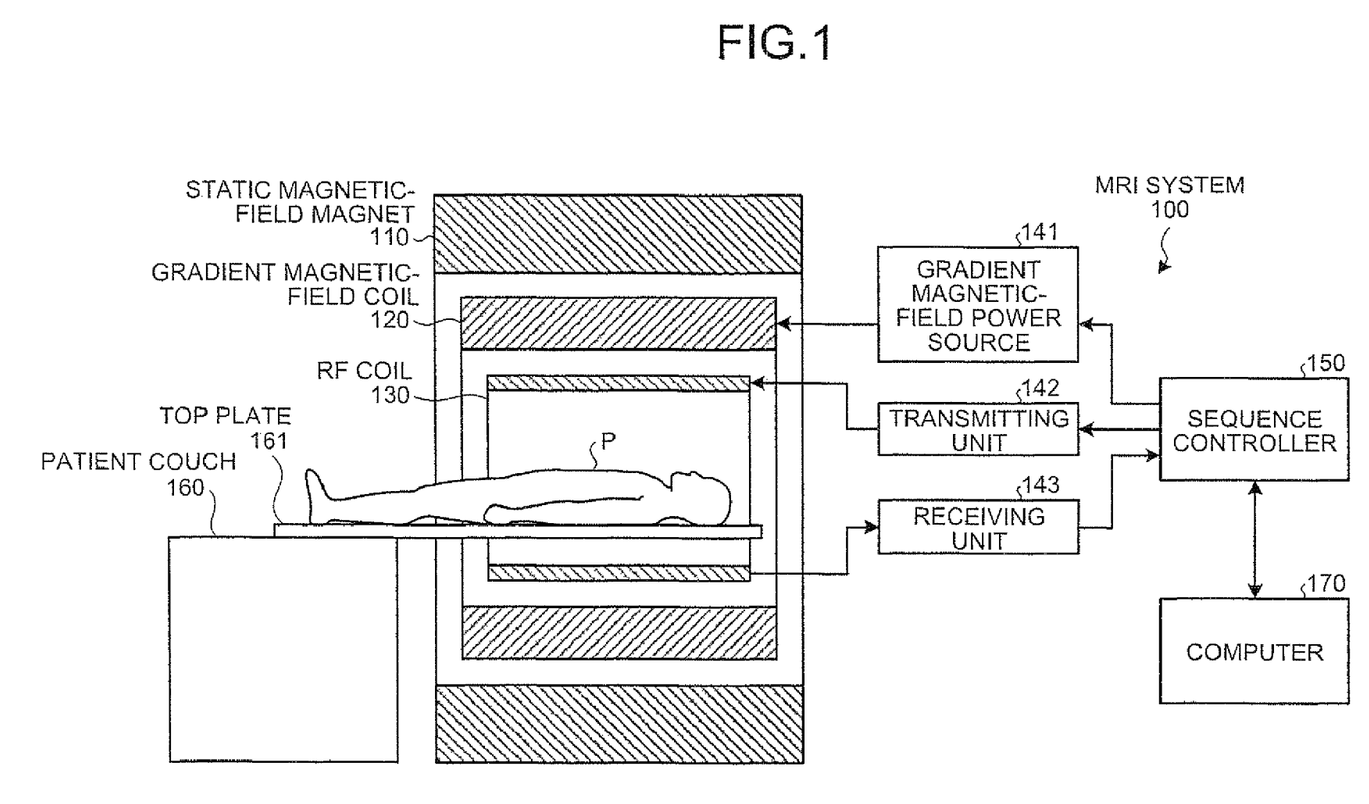
FIG. 1 is a schematic diagram for explaining a general configuration of a Magnetic Resonance Imaging (MRI) system according to an embodiment of the present invention.

First of all, a general configuration of an MRI system 100 according to an embodiment of the present invention is explained below. FIG. 1 is a schematic diagram for explaining a general configuration of the MRI system 100 according to the embodiment. As shown in FIG. 1, the MRI system 100 includes a static magnetic-field magnet 110, a gradient magnetic-field coil 120, an RF coil 130, a gradient magnetic-field power source 141, a transmitting unit 142, a receiving unit 143, a sequence controller 150, a patient couch 160, and a computer 170.

The static magnetic-field magnet 110 is a magnet formed in a cylindrical shape, and generates a static magnetic field in a space inside a barrel in which a subject P is to be placed using a current supplied from a static magnetic-field power source (not shown).

The gradient magnetic-field coil 120 is a coil arranged inside the static magnetic-field magnet 110, and generates a gradient magnetic field of which strength linearly changes along three directions of the x, y, and z axes, which are orthogonal to one another inside the static magnetic-field magnet 110, using a current supplied from the gradient magnetic-field power source 141.

The RF coil 130 is a coil for transmitting and receiving arranged to be opposed to the subject P inside an opening of the static magnetic-field magnet 110, applies a high-frequency magnetic field to the subject P by receiving supply of a high-frequency pulse from the transmitting unit 142, and receives a magnetic resonance signal emitted from hydrogen nuclei in the subject P owing to excitation. A configuration of the RF coil 130 will be explained later in detail.

The static magnetic-field magnet 110, the gradient magnetic-field coil 120, and the RF coil 130 are installed in a not-shown gantry apparatus.

The gradient magnetic-field power source 141 supplies a current to the gradient magnetic-field coil 120 based on an instruction from the sequence controller 150.

The transmitting unit 142 sends an RF pulse to the RF coil 130 based on an instruction from the sequence controller 150.

The receiving unit 143 detects a magnetic resonance signal received by the RF coil 130, and sends raw data obtained by digitalizing the detected magnetic resonance signal to the sequence controller 150.

The sequence controller 150 performs scanning of the subject P by activating the gradient magnetic-field power source 141, the transmitting unit 142, and the receiving unit 143 under control by the computer 170. When raw data is sent from the receiving unit 143 as a result of scanning, the sequence controller 150 sends the raw data to the computer 170.

The patient couch 160 includes a top plate 161 on which the subject P is to be placed, and moves the top plate 161 together with the subject P into a scan field located inside an opening provided in the gantry apparatus.

The computer 170 controls the whole of the MRI system 100, and includes an input unit, a sequence control unit, an image reconstructing unit, a storage unit, a display unit, and a main control unit. The input unit receives various inputs from an operator; the sequence control unit causes the sequence controller 150 to execute a scan based on scanning conditions input by the operator; the image reconstruction unit reconstructs an image based on raw data sent from the sequence controller 150; the storage unit stores therein, for example, a reconstructed image; the display unit displays thereon various information, such as a reconstructed image; and the main control unit controls operation of each unit based on an instruction from the operator.

The MRI system 100 includes a duct and a fan, which are not shown in FIG. 1, as a cooling unit for circulating cooling air over the surfaces of the circuit elements included in the RF coil 130. The cooling unit will be explained later in detail.

Figure 2:
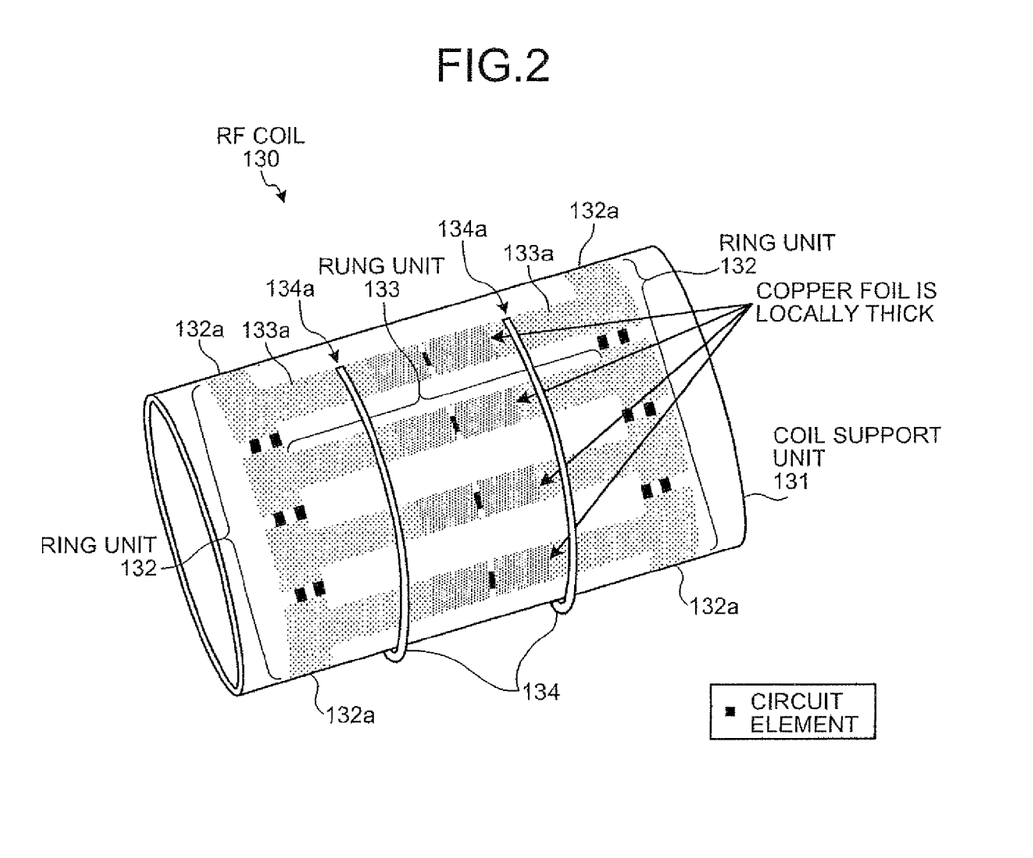
FIG. 2 is a schematic diagram illustrating a configuration of a Radio Frequency (RF) coil according to the embodiment.

A configuration of the RF coil 130 is explained below. The following description is explained using a birdcage coil as the RF coil 130. FIG. 2 is a schematic diagram that depicts a configuration of the RF coil 130. As shown in FIG. 2, the RF coil 130 includes a coil support unit 131, two ring units 132, a plurality of rung units 133, and two guide units 134.

The coil support unit 131 is a supporting member (bobbin) formed in a cylindrical shape, and supports the ring units 132, the rung units 133, and the guide units 134 at respective predetermined positions.

Each of the two ring units 132 is a conductive member formed in a ring shape by using copper foil 132a. The ring units 132 are provided such that the central axes of the rings are aligned with each other, and the rings are positioned at a predetermined distance from each other.

Each of the rung units 133 is a conductive member formed in a rectangle by using copper foil 133a. The rung units 133 are provided with predetermined intervals so as to connect between the two ring units 132.

The ring units 132 and the rung units 133 are each connected with certain circuit elements for controlling operation of the RF coil 130. The circuit elements can be, for example, a p-intrinsic-n (PIN) diode or a capacitor. The ring units 132 can be connected with capacitors, and the rung units 133 can be connected with PIN diodes in some cases; conversely, the ring units 132 can be connected with PIN diodes, and the rung units 133 can be connected with capacitors in other cases. The PIN diodes and the capacitors are collectively called circuit elements in the following description.

Figure 3:
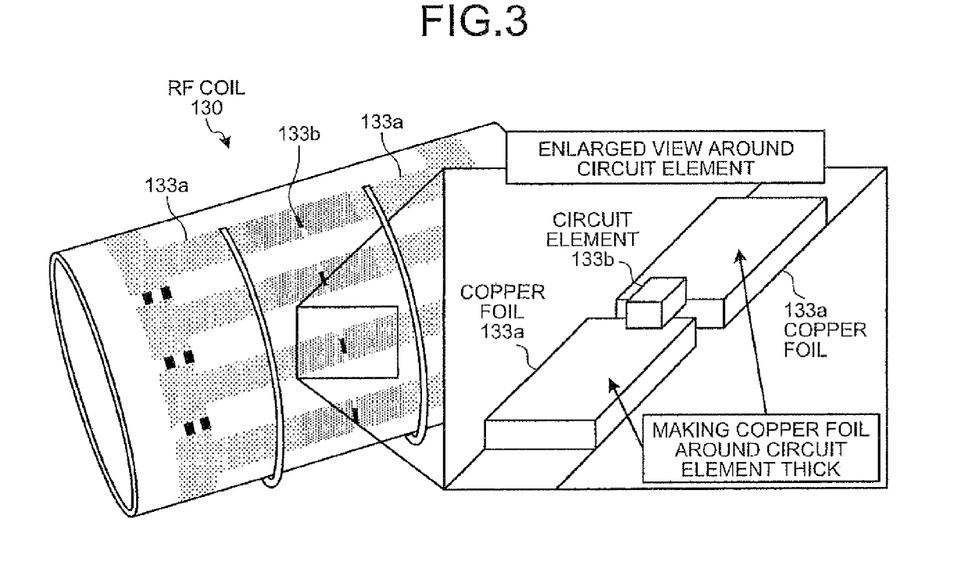
FIG. 3 is a schematic diagram illustrating a connection portion between a rung unit and a circuit element.

FIG. 3 is a schematic diagram that depicts connection portions between the rung units 133 and circuit elements. As shown in FIG. 3, for example, a slit-shaped gap is formed in each of the rung units 133 to separate the copper foil 133a at the substantially center in the longitudinal direction. A plurality of circuit elements 133b is each connected to each of the rung units 133 to cross each gap as a joint.

As shown in an enlarged view on the right side in FIG. 3, the copper foil 133a of the rung unit 133 is formed to be thicker in a peripheral portion around the circuit element 133b than the other portion. Specifically, the copper foil 133a is formed to have a larger thickness than a thickness that is determined based on a skin depth appropriate to a frequency of a high-frequency current supplied to the RF coil 130. In practice, the thickness of the conductive member is typically more than five times of the skin depth. For example, the copper foil 133a is formed to be further approximately three times of it in thickness (approximately 15 times of the skin depth).

Generally, it is known that the larger thickness of a conductive member made of a metal, such as copper foil, the larger heat capacity is provided in the conductive member. Therefore, as explained above, by increasing the thickness of the copper foil 133a, heat generated from the circuit elements is more dissipated into the conductive member, so that heat locally generated around the RF coil 130 can be suppressed.

The "skin depth" means a depth at which a high-frequency current passes through when the high-frequency current passes through the conductive member. It is generally known that when a high-frequency current passes through a conductor, the passing current concentrates on a surface of the conductor. Such phenomenon is called a "skin effect"; and when a high-frequency current is concentrated on the surface due to the skin effect, a depth at which the current passes through is called a "skin depth". The skin depth is determined in accordance with a material of the conductor and a frequency of a high-frequency wave, as the frequency is higher, the skin depth becomes shallower. Therefore, a thickness of the conductive member of the RF coil is determined based on the skin depth (for example, more than five times of the skin depth).

Figure 4:
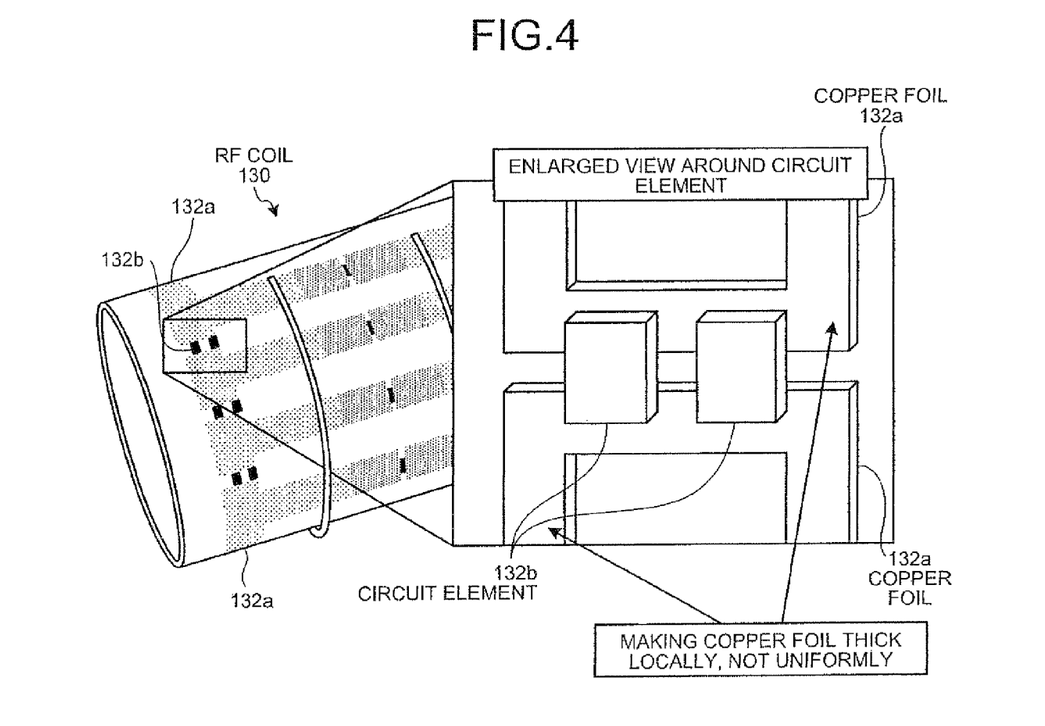
FIG. 4 is a schematic diagram illustrating a connection portion between a ring unit and circuit elements shown in FIG. 2.

FIG. 4 is a schematic diagram that depicts connection portions between the ring unit 132 and circuit elements. As shown in FIG. 4, for example, a plurality of gaps is formed in the ring unit 132 with certain intervals, and a plurality of circuit elements 132b is connected to the ring unit 132 to cross each gap as a joint.

As shown in an enlarged view on the right side in FIG. 4, the copper foil 132a of the ring unit 132 is formed to be locally thicker in a portion around each connection portion point to the circuit element 132b than the other portion. Specifically, the copper foil 132a is formed not to be uniform in thickness around each connection portion point to the circuit element 132b, and so as to have locally a larger thickness than the thickness that is determined based on the skin depth appropriate to the frequency of the high-frequency current supplied to the RF coil 130.

Generally, the larger thickness of a conductive member, the larger influence of an eddy-current generated in the RF coil by the gradient magnetic field is produced on the RF coil. For this reason, it is desirable to form the conductive member thin as much as possible. As shown in the enlarged view on the right side in FIG. 4, by forming the conductive member to have locally a thicker portion around each connection portion point to the circuit element than the other portion, heat emitted from the circuit element can be efficiently suppressed while suppressing the influence of the eddy current.

Moreover, recently, 3 tesla MRI is used for clinical use, and an MRI system that produces a static magnetic field at a higher intensity than 3 tesla MRI for other uses. Such MRI system needs to raise the frequency of a high-frequency magnetic field to be applied to the subject, i.e., the frequency of a high-frequency current to be supplied to the RE coil, along with increase in the static magnetic field intensity. As described above, when the frequency becomes higher, the skin depth at which a high-frequency current passes through becomes shallower, so that the thickness of the conductive member can be made thinner.

However, on the other hand, if the frequency of the high-frequency current becomes higher, the amount of heat generated by the circuit element generally becomes larger, so that the thickness of the conductive member needs to be thicker to dissipate heat. For this reason, in the MRI system that produces a static magnetic field at a high intensity, the RF coil is figured by using the conductive member formed to have a large difference between the thickness of a portion connected to the circuit element and the thickness of the other portion.

The thickness of the copper foil 133a of the rung unit 133 and the thickness of the copper foil 132a of the ring unit 132 do not need to be the same thickness. Usually, because heat values generated by the circuit elements vary depending on types and configurations of a circuit element, the thicknesses of respective pieces of copper foil can be changed in accordance with a type of a connected circuit element.

Accordingly, as the thickness of a portion of the conductive member around each circuit element is adjusted per type of the circuit element, rates of temperature rise of the circuit elements included in the RF coil 130 can be substantially uniform. In this way, when a temperature rise of each of the circuit elements needs to be measured to detect a temperature rise of the RE coil 130, only by measuring a temperature rise of some of the circuit elements, a temperature rise of the other circuit elements can be estimated, thereby efficiently measuring the temperature of each circuit element.

A case where a local portion around the connection portion to each of the circuit elements is made to have a large thickness in the copper foil 133a of the rung units 133 and the copper foil 132a of the ring units 132 is explained above, and furthermore, a material, a shape, or a surface area of the portion having a large thickness can be changed in accordance with a type of the circuit element. When changing a material, for example, the surface of copper foil is coated with another metal. When changing a shape, for example, the surface of a portion having a large thickness is shaped in waves, or a groove is formed on the surface. In this way, a temperature rise of the circuit elements can be adjusted by changing a material, a shape, or a surface area of the conductive member, similarly to the case of changing the thickness.

Thus, heat locally generated around the RF coil 130 due to heat generation by the circuit elements can be suppressed by forming at least a portion of each of the conductive members so as to meet at least any one of conditions of a thickness, a material, a shape, and a surface area that are capable of dissipating heat generated from the circuit elements.

The thickness, the material, the shape, or the surface area of the portion having a large thickness can be changed in accordance with a type of the circuit element.

Returning to FIG. 2, the guide unit 134 is a ring-shaped member that produces passages of cooling air over the surface of the RF coil 130. Specifically, as shown in FIG. 2, the guide units 134 are provided between one of the ring units 132 and the center of the rung unit 133, and between the other of the ring units 132 and the center of the rung unit 133, each along the circumferential direction of the RF coil 130. Part of each of the guide units 134 is provided with a break 134a of a predetermined width.

A bore tube in cylindrical shape, which is not shown, is formed outside the RF coil 130 so as to cover the RF coil 130. Accordingly, as the guide units 134 are provided, spaces sandwiched between the coil support unit 131 and the bore tube and partitioned with the guide units 134 are formed on the surface of the RF coil 130. The spaces are to be passages through which cooling air flows over the surface of the RF coil 130. As the passages are formed in this way, cooling air flows along each circuit element on the surface of the REF coil 130.

Figure 5:
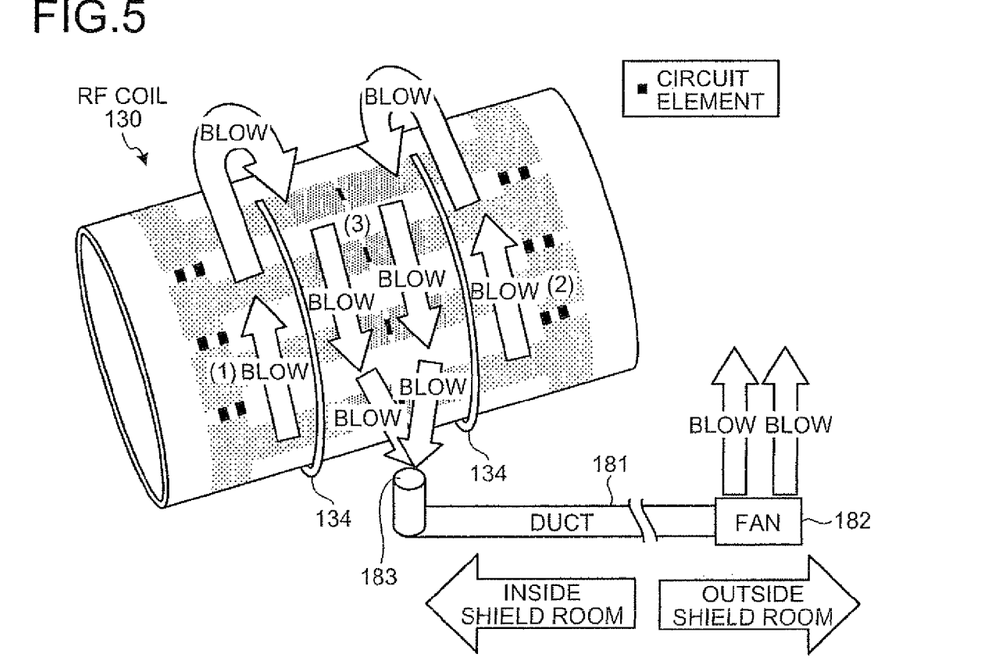
FIG. 5 is a schematic diagram (1) illustrating passages and flows of cooling air formed with guide units shown in FIG. 2.
Figure 6:
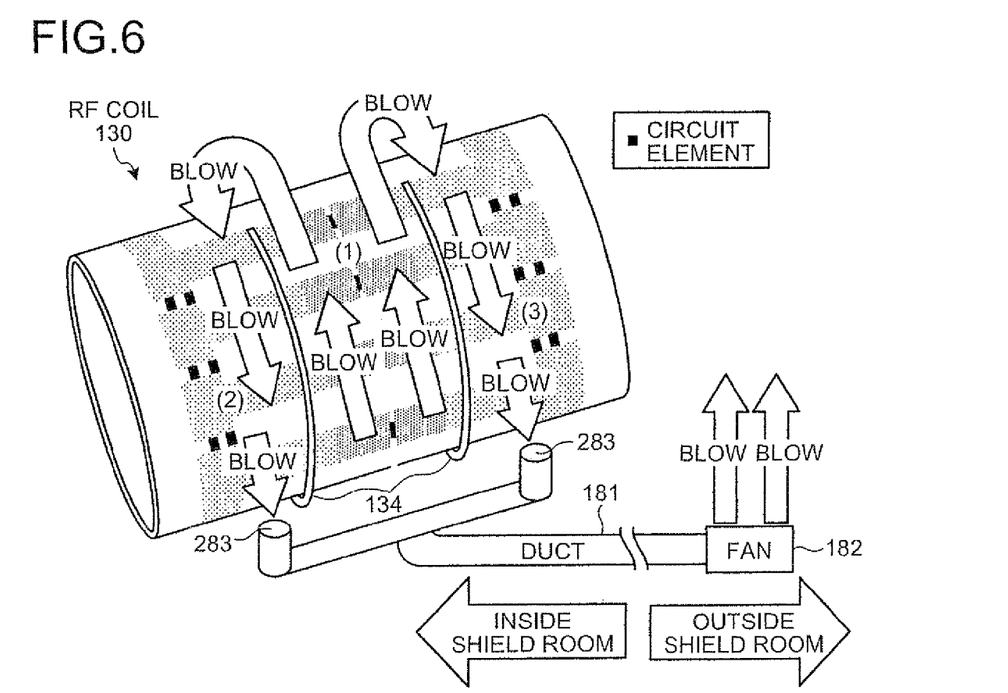
FIG. 6 is a schematic diagram (2) illustrating passages and flows of cooling air formed with the guide units.

FIGS. 5 and 6 are schematic diagrams that depict passages and flows of cooling air formed with the guide units 134. Specifically, as shown in FIG. 5, a first passage running along the circuit elements 132b included one of the ring units 132 (see (1) shown in FIG. 5), a second passage running along the circuit elements 132b included the other of the ring units 132 (see (2) shown in FIG. 5), and a third passage running along the circuit elements 133b (see (3) shown in FIG. 5) are formed with the guide units 134.

According to FIG. 5, a duct 181 and a fan 182 are a cooling unit for circulating cooling air over the surfaces of the circuit elements provided in the RF coil 130. The duct 181 is an exhaust pipe mounted between an exhaust vent 183 and the fan 182 provided near the RF coil 130. For example, the duct 181 is mounted below top-plate rails (a supporting unit that supports the top plate 161 movably in the horizontal direction) provided in the lower part inside the RF coil 130 along the top-plate rails.

The fan 182 is a suction device that sucks air via the duct 181. The fan 182 is provided outside a shield room in which the MRI system 100 is placed. In this way, as the fan 182 is provided outside the shield room, inclusion of a noise into a signal received by the RF coil 130 due to an influence of an electric system of the fan 182 can be avoided.

For example, if the exhaust vent 183 is provided in the vicinity of the third passage as shown in FIG. 5, when the fan 182 is driven, air on the surface of the RF coil 130 is sucked via the duct 181, and then a blow of cooling air flowing through the third passage is generated. Accordingly, the cooling air flows along the circuit elements 133b included in the rung units 133. Furthermore, air flows from the first and second passages into the third passage via the breaks 134a provided in the guide unit 134. Accordingly, the cooling air flows along the circuit elements 132b included in the ring units 132.

In this way, the passages of cooling air are formed with the guide units 134 on the surface of the RE coil 130 such that cooling air circulated by the duct 181 and the fan 182 flows along the surfaces of the circuit elements, thereby efficiently cooling heat generated by the circuit elements.

Generally, a plurality of capacitors is provided in the ring units 132, and a plurality of PIN diodes is provided in the rung units 133. Or, on the contrary, a plurality of PIN diodes is provided in the ring units 132, and a plurality of capacitors is provided in the rung units 133. Or, Capacitors and PIN diodes are provided in either the ring units 132 or the rung units 133 or both.

Suppose there is a difference in heat release values between the circuit elements 132b provided in the ring units 132 and the circuit elements 133b provided in the rung units 133 in such configuration. In such case, a higher cooling efficiency in the whole of the RF coil 130 can be achieved by flowing the cooling air over the surface of circuits with a smaller heat release value after cooling circuits with a larger heat release value.

For example, if a heat release value of the circuit elements 132b provided in the ring units 132 is larger than that of the circuit elements 133b provided in the rung units 133, the cooling air is caused to flow as shown in FIG. 5. Precisely, the cooling air flows along the circuit elements 132b provided in the ring units 132 (see (1) and (2) shown in FIG. 5), and then flows along the circuit elements 133b provided in the rung units 133 (see (3) shown in FIG. 5).

On the other hand, if a heat release value of the circuit elements 133b provided in the rung units 133 is larger than that of the circuit elements 132b provided in the ring units 132, exhaust vents 283 are provided each in the vicinity of each of the ring units 132 as shown in FIG. 6. Accordingly, the cooling air flows along the circuit elements 133b provided in the rung units 133 (see (1) shown in FIG. 6), and then flows along the circuit elements 132b provided in the ring units 132 (see (2) and (3) shown in FIG. 6).

In this way, when the RF coil 130 includes first circuit elements and second circuit elements of which heat-generation property is higher than that of the first circuit elements, the whole of the RF coil 130 can be efficiently cooled as the cooling unit circulates cooling air to pass on the surfaces of the first circuit elements after passing on the surfaces of the second circuit elements.

A case where there is a difference in heat release values between the circuit elements 132b provided in the ring units 132 and the circuit elements 133b provided in the rung units 133 is explained above. Additionally in another case where there is an upper limit of generated-heat temperature acceptable among the both of the circuit elements, the whole of the RF coil 130 can be efficiently cooled by changing passages of cooling air similarly to the above.

Although a method of circulating cooling air is explained above in a case where a suction device (the fan 182) is used to suck air, cooling air can be circulated by feeding air on the contrary. In such case, an air feeding device that feeds air via the duct 181 is used. As a device for circulating cooling air, either of a suction device or an air feeding device can be used, still it is preferable to use a suction device when taking into account the efficiency of air circulation.

As described above, according to the embodiment, the RF coil 130 includes a plurality of conductive members and circuit elements connected to each of the conductive members, and each conductive member is formed such that at least part of the member is in a thickness to dissipate heat generated from the circuit element, so that the heat generated from the circuit element can be dissipated into the conductive member, and heat locally generated around the RF coil 130 due to heat generation by the circuit elements can be suppressed.

Moreover, according to the embodiment, because the MRI system 100 is configured to include the cooling unit that circulate cooling air over the surfaces of the circuit elements included in the RF coil 130, instead of directly blowing cooling air to the whole of the RF coil 130 as conventionally performed, the circuit elements that release heat can be directly cooled, so that heat locally generated around the RF coil 130 due to heat generation by the circuit elements can be suppressed.

Figure 7:
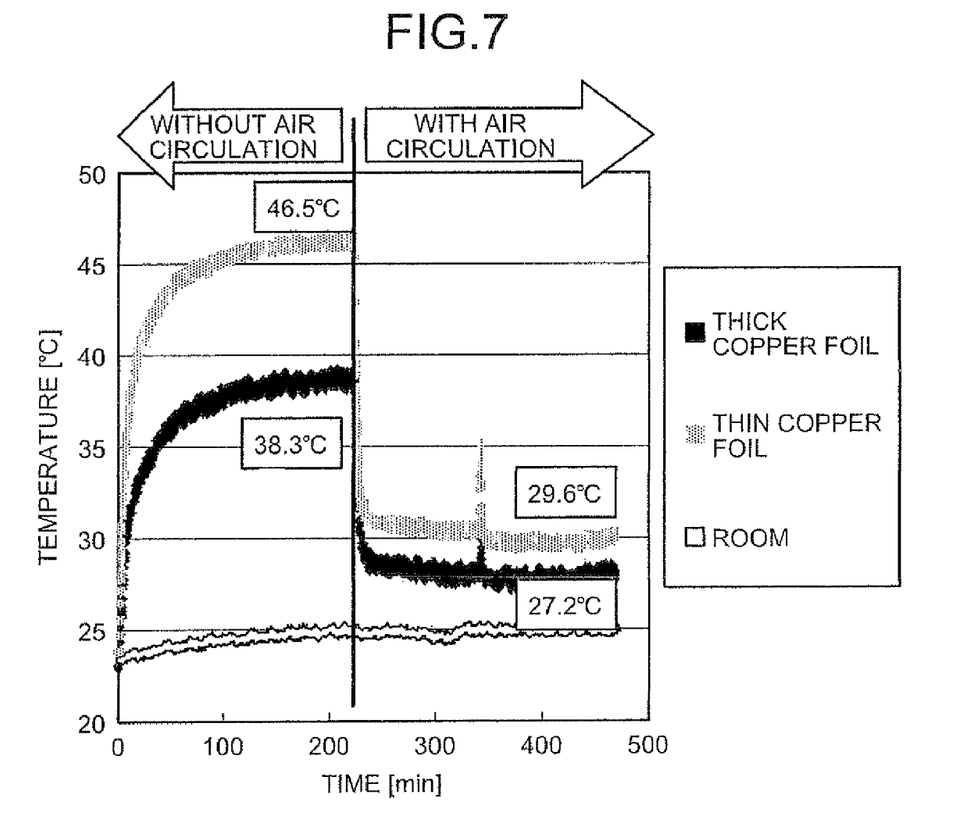
FIG. 7 is a graph illustrating relation between thickness of copper foil, presence or absence of air circulation, and change in temperature around the circuit elements in the RF coil shown in FIG. 2.

There has been mainly explained above the configuration of the MRI system 100, and finally effectiveness of the MRI system 100 is shown below with reference to test results. FIG. 7 is a graph that depicts relation between thickness of copper foil, presence or absence of air circulation, and change in temperature around the circuit elements, in the RF coil.

The figure depicts temperature change around circuit elements in an MRI system provided with guide units on the surface of a Whole Body (WB) coil, where the temperature was measured in the following conditions: when the thickness of copper foil was thin, when it was thick, when there was air circulation, and when there was no air circulation. Specifically, results of respective measurements of a temperature change of copper foil around PIN diodes when the thickness of the copper foil is 0.03 mm, a temperature change of copper foil around PIN diodes when the thickness of the copper foil is 0.3 mm, and a temperature change in a shield room in which the MRI system is placed.

As shown in the figure, the temperature around the PIN diodes decreased by 8.2 degrees Celsius by changing the thickness of the copper foil from 0.03 mm to 0.3 mm. When performing air suction by driving a fan, the temperature around the PIN diodes further decreased by 11.1 degrees Celsius. According to the results, it is observed that the MRI system according to the embodiment can actually suppress heat locally generated around the RF coil due to heat generation by the circuit elements.

The embodiment is explained above in a case where the MRI system is provided with both of the conductive members (copper foil) with an increased thickness, and the cooling unit; however, the present invention is not limited to this, and the MRI system can be provided with only one of those. Even when being provided with only one of the conductive members and the cooling unit, it is obvious that an intended effect is to be obtained.

The embodiment is explained above in a case of an RF coil of the birdcage type; however, the present invention is not limited to this, and can be applied to an RF coil in another shape, such as a saddle type, a solenoid type, or a slot resonator type.

Moreover, the embodiment is explained in a case where the conductive members included in the RF coil are copper foil; however, the present invention is not limited to this, and can be similarly applied to a case where the conductive members are made of another metal, such as gold or silver.

Thus, the magnetic resonance imaging system and the RF coil according to the embodiment of the present invention are useful for suppressing heat generated around the RF coil, and particularly suitable for suppressing heat locally generated by the circuit elements included in the RF coil.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging system comprising:
a Radio Frequency (RF) coil that applies a high-frequency magnetic field to a subject placed in a static magnetic field, wherein the RF coil includes
a plurality of conductive members; and
circuit elements electrically connected to respective end portions of the conductive members, and
each of the conductive member end portions in the vicinity of a respective circuit element being at least partially formed so as to meet at least any one of conditions of a thickness, a shape, and a material that enhances dissipation of heat generated from the respectively associated circuit element.

2. The system according to claim 1, wherein each of the conductive members is formed such that an end portion in a vicinity of a connection portion to each of the circuit elements locally has a larger thickness than other portions.

3. The system according to claim 2, wherein the material is determined in accordance with the connected circuit element type.

4. The system according to claim 2, wherein the shape is determined in accordance with the connected circuit element type.

5. The system according to claim 2, further comprising a cooling unit that circulates cooling air over surfaces of the circuit elements.

6. The system according to claim 5, wherein
the RF coil includes as the circuit elements a first circuit element and a second circuit element wherein an amount of generated heat from the second circuit element is larger than that from the first circuit element, and
the cooling unit circulates the cooling air so as to pass on a surface of the first circuit element after passing on a surface of the second circuit element.

7. The system according to claim 5, wherein
the RF coil includes as the circuit elements a first circuit element and a second circuit element wherein the second circuit element has a higher acceptable upper limit of generated-heat temperature than that of the first circuit element, and
the cooling unit circulates the cooling air so as to pass on a surface of the first circuit element after passing on a surface of the second circuit element.

8. The system according to claim 1, wherein the thickness is determined in accordance with the connected circuit element type.

9. The system according to claim 8, further comprising a cooling unit that circulates cooling air over surfaces of the circuit elements.

10. The system according to claim 9, wherein
the RF coil includes as the circuit elements a first circuit element and a second circuit element wherein an amount of generated heat from the second circuit element is larger than that from the first circuit element, and
the cooling unit circulates the cooling air so as to pass on a surface of the first circuit element after passing on a surface of the second circuit element.

11. The system according to claim 9, wherein
the RF coil includes as the circuit elements a first circuit element and a second circuit element wherein the second circuit element has a higher acceptable upper limit of generated-heat temperature than that of the first circuit element, and
the cooling unit circulates the cooling air so as to pass on a surface of the first circuit element after passing on a surface of the second circuit element.

12. The system according to claim 1, wherein the material is determined in accordance with the connected circuit element type.

13. The system according to claim 1, wherein the shape is determined in accordance with the connected circuit element type.

14. The system according to claim 1, wherein the portion of the conductive member formed so as to meet one of the conditions is formed to have a surface that enhances dissipation of heat generated from the circuit elements.

15. The system according to claim 14, wherein the surface area is determined in accordance with the connected circuit element type.

16. The system according to claim 1, further comprising a cooling unit that circulates cooling air over surfaces of the circuit elements.

17. The system according to claim 16, wherein
the RF coil includes as the circuit elements a first circuit element and a second circuit element wherein an amount of generated heat from the second circuit element is larger than that from the first circuit element, and
the cooling unit circulates the cooling air so as to pass on a surface of the first circuit element after passing on a surface of the second circuit element.

18. The system according to claim 16, wherein
the RF coil includes as the circuit elements a first circuit element and a second circuit element wherein the second circuit element has a higher acceptable upper limit of generated-heat temperature than that of the first circuit element, and
the cooling unit circulates the cooling air so as to pass on a surface of the first circuit element after passing on a surface of the second circuit element.

19. A Radio Frequency (RF) coil that is provided in a magnetic resonance imaging system and that applies a high-frequency magnetic field to a subject placed in a static magnetic field, the RF coil comprising:
a plurality of conductive members; and
circuit elements electrically connected to respective end portions of the conductive members, wherein
each of the conductive member end portions in the vicinity of a respective circuit element being at least partially formed so as to meet at least any one of conditions of a thickness, a shape, and a material that enhances dissipation of heat generated from the respectively associated circuit element.

20. The RF coil according to claim 19, wherein the conductive member end portion is formed so as to have a thickness larger than a thickness determined based on a skin depth corresponding to a frequency of a high-frequency current that generates the high-frequency magnetic field.

* * * * *